United States Patent
Chung et al.

(10) Patent No.: US 8,816,368 B2
(45) Date of Patent: Aug. 26, 2014

(54) P-CONTACT LAYER FOR A III-P SEMICONDUCTOR LIGHT EMITTING DEVICE

(75) Inventors: Theodore Chung, Santa Clara, CA (US); Anneli Munkholm, Mountain View, CA (US)

(73) Assignee: Koninklijke Philips N.V., Eindhoven (NL)

( * ) Notice: Subject to any disclaimer, the term of this patent is extended or adjusted under 35 U.S.C. 154(b) by 322 days.

(21) Appl. No.: 13/204,750

(22) Filed: Aug. 8, 2011

(65) Prior Publication Data

US 2011/0284891 A1    Nov. 24, 2011

Related U.S. Application Data

(63) Continuation of application No. 12/494,988, filed on Jun. 30, 2009, now Pat. No. 8,017,958.

(51) Int. Cl.
*H01L 33/00* (2010.01)

(52) U.S. Cl.
USPC .......................................................... 257/96

(58) Field of Classification Search
CPC .......... H01L 33/02; H01L 33/14; H01L 33/30
USPC ........................ 257/79, 96, E33.027, E33.026
See application file for complete search history.

(56) References Cited

U.S. PATENT DOCUMENTS

| | | | |
|---|---|---|---|
| 4,582,952 A * | 4/1986 | McNeely et al. | 136/249 |
| 4,680,602 A | 7/1987 | Watanabe et al. | |
| 5,557,627 A | 9/1996 | Schneider et al. | |
| 5,739,553 A | 4/1998 | Noto | |
| 6,324,201 B1 | 11/2001 | Ohya | |
| 6,462,358 B1 | 10/2002 | Lin et al. | |
| 6,784,463 B2 | 8/2004 | Camras et al. | |
| 7,019,330 B2 | 3/2006 | Ludowise | |
| 7,244,630 B2 | 7/2007 | Krames et al. | |
| 2002/0104997 A1 * | 8/2002 | Kuo et al. | 257/79 |
| 2002/0158264 A1 | 10/2002 | Nakamura et al. | |

FOREIGN PATENT DOCUMENTS

| | | |
|---|---|---|
| EP | 0720242 A2 | 7/1996 |
| JP | 05251739 | 9/1993 |
| JP | 08-204236 | 8/1996 |
| JP | 11220222 | 8/1999 |
| JP | 2001298242 | 10/2001 |
| JP | 2002223040 | 8/2002 |
| JP | 2005150645 | 6/2005 |
| JP | 2005150664 | 6/2005 |
| JP | 2005340659 | 8/2005 |
| JP | 2007042851 | 2/2007 |
| JP | 2009004477 | 8/2009 |

OTHER PUBLICATIONS

Haitz et al., "Light-Emitting Diodes", 1995, Handbook of Optics, Chapter 12, pp. 12.1-12.39 (Dec. 1995).*

* cited by examiner

*Primary Examiner* — Nikolay Yushin

(57) ABSTRACT

A device includes a semiconductor structure with at least one III-P light emitting layer disposed between an n-type region and a p-type region. The semiconductor structure further includes a $GaAs_xP_{1-x}$ p-contact layer, wherein x<0.45. A first metal contact is in direct contact with the $GaAs_xP_{1-x}$ p-contact layer. A second metal contact is electrically connected to the n-type region. The first and second metal contacts are formed on a same side of the semiconductor structure.

12 Claims, 3 Drawing Sheets

P-CONTACT LAYER FOR A III-P SEMICONDUCTOR LIGHT EMITTING DEVICE

This is a continuation of a prior application, Ser. No. 12/494,988 filed Jun. 30, 2009, and is incorporated by reference herein.

FIELD OF INVENTION

The present invention relates to a III-P light emitting device, and in particular to a contact layer for a flip chip III-P light emitting device.

BACKGROUND

Group III-P semiconductor devices such as $(Al_xGa_{1-x})_{1-y}In_yP$ light emitting diodes (LEDs) are used to produce visible wavelengths from red to amber. AlInGaP LEDs are typically formed by growing epitaxial layers, including p-type and n-type layers sandwiching a light-emitting active layer, on a GaAs growth substrate. High quality ternary and quaternary substrates are very difficult to fabricate, so GaAs substrates are commonly used. To produce low-defect LED layers, the lattice constant of the $(Al_xGa_{1-x})_{1-y}In_yP$ epitaxial layers must match the lattice constant of the GaAs. To match the GaAs lattice constant, y=0.48. The x value is adjusted to achieve the desired emission wavelength.

A flip chip III-P LED described in U.S. Pat. No. 7,244,630 is illustrated in FIG. 1. A lower confining layer 22 of n-type AlInP is grown on a growth substrate (not shown). The AlInP confining layer 22 has a band gap that is higher than the band gap of the active layer. An active layer 24 of $(Al_xGa_{1-x})_{0.47}In_{0.53}P$, which may comprise a plurality of layers, is grown over the confining layer 22. A p-type upper confining layer 26 of AlInP is grown over the active layer 24. A highly doped p-type AlInGaP contact layer 71 may be provided over layer 26. Layers 24, 26, and 71 are etched to expose the n-AlInP confining layer 22 for electrical contact. A metal n-electrode 83 is then formed to electrically contact the n-AlInP confining layer 22, and a p-electrode 84 is formed to contact the p+ AlInGaP layer 71.

The p and n-electrodes are bonded to metal pads on the package element 87. The substrate may be removed after bonding the electrodes to the package element 87. Vias electrically couple the metal pads on the top of package element 87 to p- and n-electrodes 90, 91 on the bottom of package element 87. Electrodes 90, 91 may be soldered to pads on a circuit board or to pads on another package.

The top surface of the LED (the n-AlInP layer 22 in the example) is further processed to have light extraction features 92. Such features may include roughening or other techniques, such as ordered texturing or a photonic crystal structure, to increase the light output.

SUMMARY

It is an object of the invention to form a device with a $GaAs_xP_{1-x}$ p-contact layer and a metal contact in direct contact with the $GaAs_xP_{1-x}$ p-contact layer. Embodiments of the invention may have lower contact resistance than conventional III-P devices.

In accordance with embodiments of the invention, a device includes a semiconductor structure with at least one III-P light emitting layer disposed between an n-type region and a p-type region. The semiconductor structure further includes a $GaAs_xP_{1-x}$ p-contact layer, wherein x<0.45. A first metal contact is in direct contact with the $GaAs_xP_{1-x}$ p-contact layer. A second metal contact is electrically connected to the n-type region. The first and second metal contacts are formed on a same side of the semiconductor structure.

DETAILED DESCRIPTION

Figure 1:
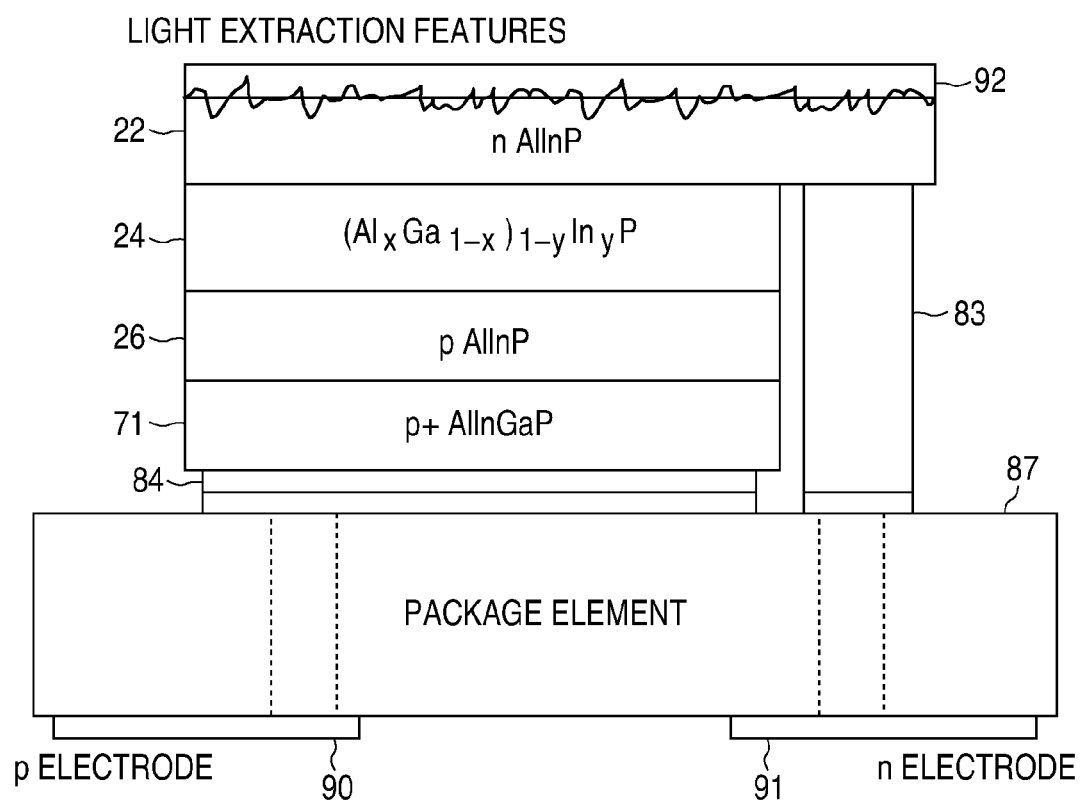
FIG. 1 illustrates a prior art flip chip III-P LED.

In the devices such as the device illustrated in FIG. 1, contact layer 71 is typically GaP. It is difficult to form an Ohmic p-contact to GaP without reducing the reflection caused by photon scattering at the metal-semiconductor interface. The p-metal-semiconductor interface is preferably as smooth and uniform as possible, to minimize photon scattering. A conventional p-metal contact formed on a GaP contact layer typically introduces metal spikes and a non-uniform interface, which causes undesirable photon scattering.

In embodiments of the invention, the metal p-contact is formed on a GaAsP contact layer, rather than a GaP contact layer.

Figure 2:
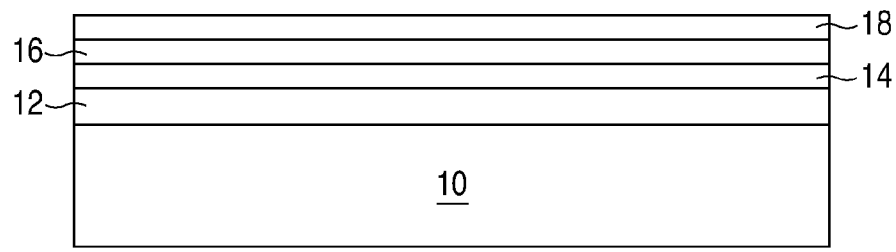
FIG. 2 illustrates a III-P device structure grown on a growth substrate.
Figure 3A:
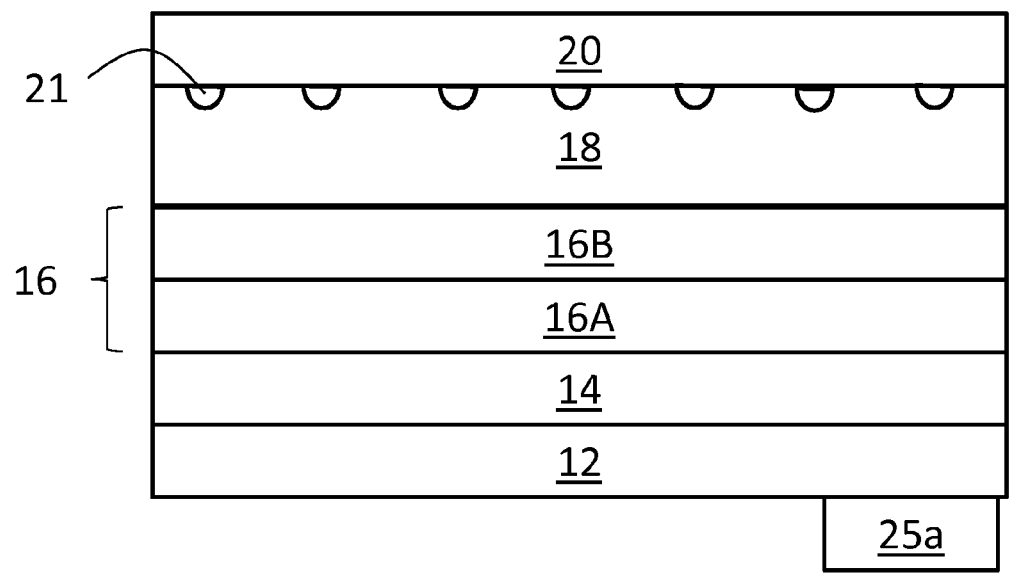
FIG. 3 illustrates the structure of FIG. 2 after forming a p-contact, etching a mesa, and forming an n-contact.
Figure 3:
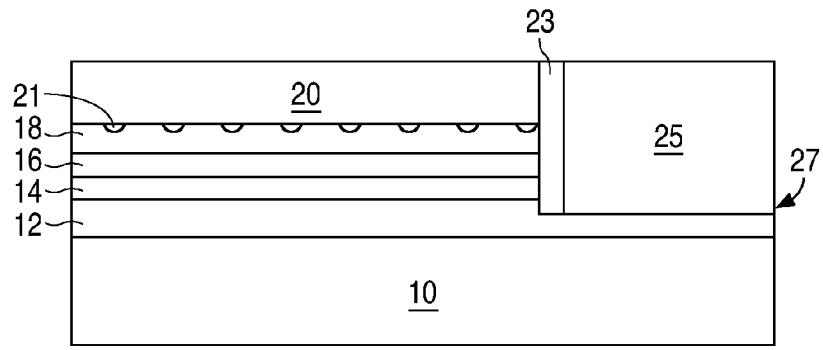
Figure 4:
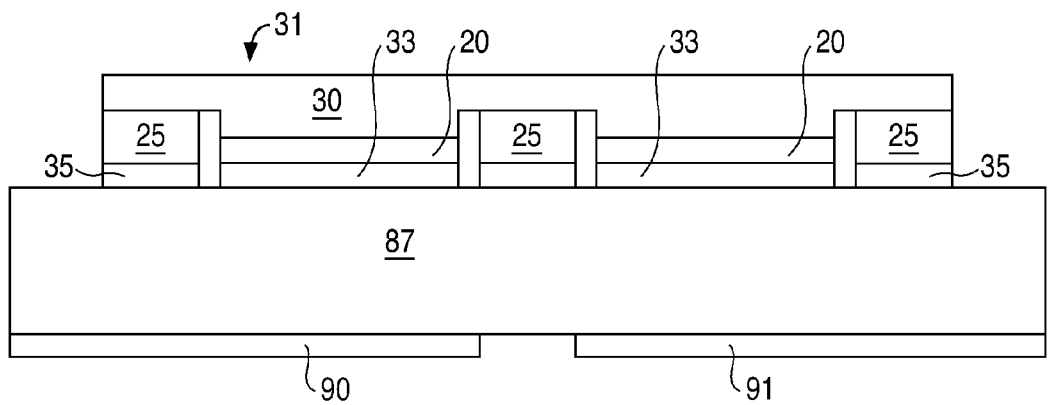
FIG. 4 illustrates a III-P device mounted on a mount.

FIGS. 2-4 illustrate forming a device according to embodiments of the invention. In FIG. 2, a device structure is grown on a growth substrate 10, which may be GaAs or any suitable growth substrate. An n-type region 12 is grown first on growth substrate 10. N-type region 12 may include multiple layers of different compositions and dopant concentration including, for example, preparation layers such as buffer layers or nucleation layers, which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light. N-type region 12 may include, for example, an $(Al_xGa_{1-x})_{0.52}In_{0.48}P$ n-contact layer, where x=0.4.

A light emitting or active region 14 is grown over n-type 12. Active region 14 may be a single thick or thin light emitting layer, or a multi-quantum well active region including multiple thin or thick quantum well light emitting layers separated by barrier layers.

Figure 2A:
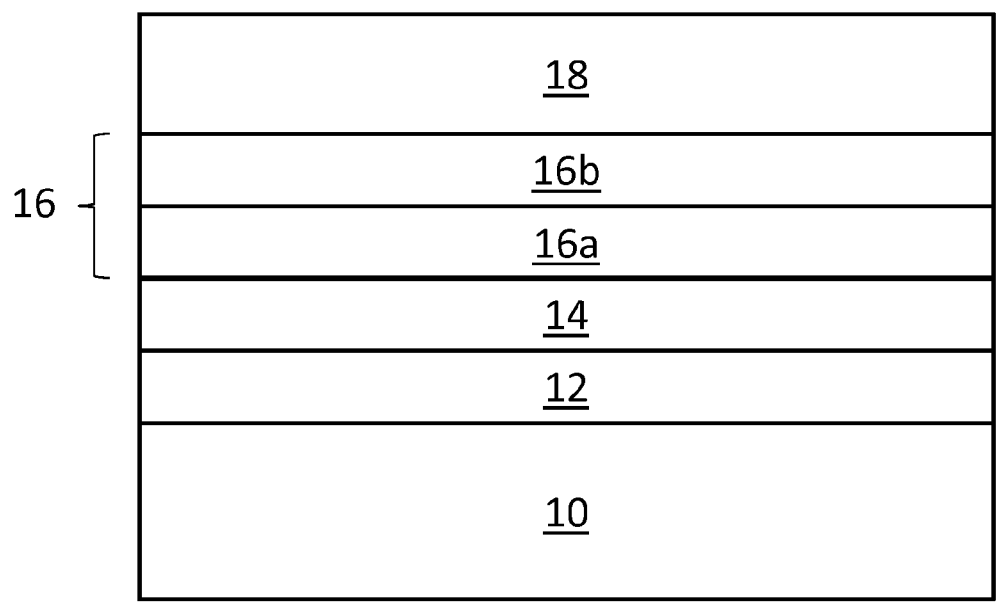

A p-type region 16 is grown over active region 14. Like the n-type region 14, the p-type region 16 may include multiple layers of different composition, thickness, and dopant concentration, including layers that are not intentionally doped, or n-type layers. P-type region 16 may include, for example, a GaP or a AlInP p-cladding layer. In some embodiments, as shown in FIG. 2A, p-type region 16 includes a cladding layer 16a adjacent to the active region 14 and a transition region 16b disposed between the cladding layer 16a and a contact layer described below. For example, the cladding layer may be a 1.5 μm thick $Al_{0.48}In_{0.52}P$ (or AlInGaP) layer and the transition region 16b may be a thin (thickness 20-5000 Å) compositionally graded $(Al_xGa_{1-x})_{0.5}In_{0.5}P$ layer, graded for example from AlInP to $(Al_{0.3}Ga_{0.7})_{0.47}In_{0.53}P$.

In accordance with embodiments of the invention, a p-contact layer 18 is grown over p-type region 16. P-contact layer 18 may be, for example, $GaAs_xP_{1-x}$. The As composition x is less than 0.45, such that the material is in the indirect band gap region, to minimize absorption. P-contact layer 18 may have a constant composition x, or may be compositionally graded from x=0 (GaP), to $GaAs_xP_{1-x}$, where x<0.45. In a p-contact layer 18 with constant composition x, 0<x<0.45 in some embodiments, 0.2<x<0.4 in some embodiments, and x=0.3 in some embodiments. In a compositionally graded p-contact layer 18, x is graded from 0 to 0.45 in some embodiments, from 0 to between 0.2 and 0.4 in some embodiments, and from 0 to 0.3 in some embodiments. P-contact layer 18 may be doped with, for example, Mg, Zn, or C, to a concentration between 3e18 $cm^{-3}$ and 1e19 $cm^{-3}$. P-contact layer 18 may be, for example, between 20 Å and 2 μm thick in some embodiments, and 0.5 μm thick in some embodiments.

In some embodiments, a GaAsP p-contact layer 18 is grown using tetrabutylarsine (TBAs) as the arsine source and tetrabutylphosphine (TBP) as the phosphine source. Replacing conventional sources such as arsine ($AsH_3$) and phosphine ($PH_3$) with TBAs and TBP may permit the p-contact layer 18 to be grown at a lower temperature, which may lead to higher quality material with better contact properties. For example, the growth temperature can be reduced by as much as 100° C. when TBAs and TBP are used as sources, which may increase Mg doping incorporation efficiency by a factor of 2-2.5. The increase in Mg doping efficiency enables a lower reactor background concentration (lower residual dopants in the background) and may produce more consistent LEDs with higher light output.

In FIG. 3, contact metals are formed and a mesa is etched in the device. A p-contact may be formed first, for example by depositing an ohmic contact metal in discrete regions 21. Ohmic contact metal 21 may be, for example, AuZn or Al, formed in dots, then annealed. A mirror 20, which may be, for example, silver, is formed over ohmic contact metal regions 21. Ohmic regions 21 are between 1 and 5 μm in diameter in some embodiments and 3 μm in diameter in some embodiments, and are spaced between 5 and 15 μm apart in some embodiments and 10 μm apart in some embodiments.

Portions of the p-contact, p-type layers 16 and 18, and active region 14 may be removed to expose a portion 27 of n-type region 12. An n-contact 25, which may be, for example, AuGe, is formed on the exposed portion 27 of n-type region 12. The n- and p-contacts 25 and 20/21 may be electrically isolated by a trench which may be filled with an insulating material 23. The portion of n-type region 27 exposed by etching for forming a contact may be distributed across the device.

In FIG. 4, the device is attached to a mount and the growth substrate is removed. N- and p-contacts 25 and 20 are electrically and physically connected to mount 87 by n- and p-interconnects 35 and 33. The interconnects may be, for example, solder, gold, or any other suitable material. The device may be attached to mount 87 by, for example, reflowing solder interconnects or ultrasonic bonding of gold interconnects. Vias (not shown in FIG. 4) electrically couple metal pads on the top of mount 87 to p- and n-electrodes 90, 91 on the bottom of mount 87. Electrodes 90, 91 may be soldered to pads on a circuit board or to pads on another package.

After mounting the device on mount 87, growth substrate 10 may be removed, for example by etching. The semiconductor structure 30 remaining after removing the growth substrate may be thinned. The top surface may be textured, for example by roughening or etching to form a pattern such as a photonic crystal, to improve light extraction.

In the alternative as shown in FIG. 3A a p-contact formed as described above may be combined with an n-contact 25a, which may include a second metal contact electrically connected to the n-type 12 region opposite the side of the semiconductor structure utilized by the p-contact.

Figure 5:
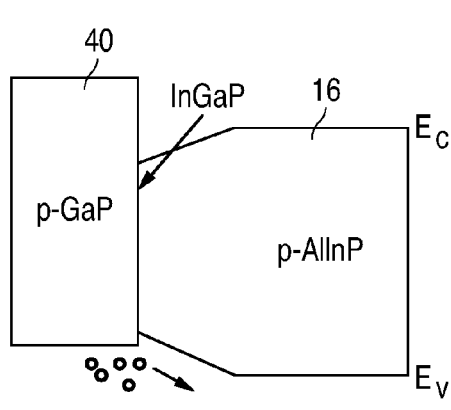
FIG. 5 illustrates an energy band diagram for a portion of a device with a conventional contact layer.
Figure 6:
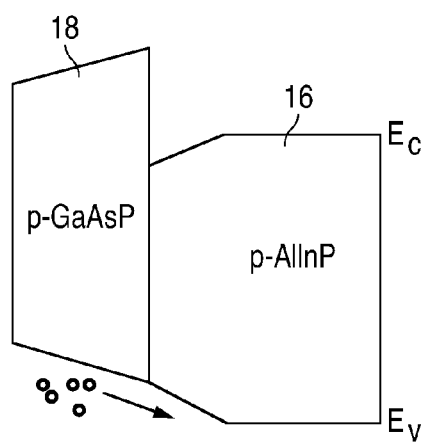
FIG. 6 illustrates an energy band diagram for a portion of a device according to embodiments of the invention.

FIG. 5 illustrates the band diagram of a portion of a device including a conventional GaP contact layer. FIG. 6 illustrates the band diagram of a portion of a device including a GaAsP contact layer and a graded $(Al_xGa_{1-x})_{0.5}In_{0.5}P$ transition layer according to embodiments of the invention. The notch in the valence band between p-type region 16 and p-GaP contact layer 40 in FIG. 5 can trap holes. As illustrated in FIG. 6, the valence band of a GaAsP contact layer 18 aligns more favorably with that of the transition layer in p-type region 16, and GaAsP has a smaller band gap, which may increase the active hole concentration and reduce the contact resistance, which in turn may reduce the turn-on voltage and increase wall-plug efficiency.

In addition, GaAsP p-contact layer 18 is highly transparent to wavelengths between 580 and 620 nm, a wavelength range commonly emitted by the active region 14 described above. The transparency of GaAsP p-contact layer 18 may reduce internal absorption and increase extraction of light from the device.

Further, forming a conventional p-metal contact on a GaP contact layer often results in metal spikes and a non-uniform interface, which causes undesirable photon scattering. Metal spikes may be formed during the alloying process (which may be, for example, a high-temperature anneal) after p-metal deposition. During the alloying step, metals diffuse into the p-contact semiconductor layer at a non-uniform rate. As a result, some areas of the contact layer have a larger metal penetration, while other areas have less. The non-uniform penetration may cause photons to be scattered or absorbed at the interface, for example when the diffused metal forms an alloy with the p-contact layer that absorbs photons. $GaAs_xP_{1-x}$ contact layers according to embodiments of the invention, as described above, have a more favorable band lineup with the p-contact metal, such that alloying may not be necessary, or the alloying temperature may be reduced, resulting in a more uniform interface and fewer metal spikes.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
a semiconductor structure comprising:
at least one III-P light emitting layer disposed between an n-type region and a p-type region;
a $GaAs_xP_{1-x}$ p-contact layer, wherein x<0.45;
a first metal contact in direct contact with the $GaAs_xP_{1-x}$ p-contact layer comprising:
a mirror; and
a plurality of ohmic contact regions disposed between the mirror and the $GaAs_xP_{1-x}$ p-contact layer; and
a second metal contact electrically connected to the n-type region;
wherein the first and second metal contacts are formed on opposite sides of the semiconductor structure.

2. The device of claim 1 wherein the $GaAs_xP_{1-x}$ p-contact layer has a graded composition x.

3. The device of claim 1 wherein the $GaAs_xP_{1-x}$ p-contact layer has a composition graded from x=0 to x <0.45.

4. The device of claim 1 wherein the mirror comprises silver, Al, or Au, dielectric layers ($SiO_2$ or $Si_{1-x}N_x$), and the plurality of ohmic contact regions comprise one of AuZn, Al, indium tin oxide (ITO).

5. The device of claim 1 wherein the $GaAs_xP_{1-x}$ p-contact layer has a constant composition x.

6. The device of claim 5 wherein $0.2<x<0.4$.

7. A device comprising:
a semiconductor structure comprising:
at least one III-P light emitting layer disposed between an n-type region and a p-type region;
a $GaAs_xP_{1-x}$ p-contact layer, wherein $x<0.45$;
a first metal contact in direct contact with the $GaAs_xP_{1-x}$ p-contact layer;
a second metal contact electrically connected to the n-type region;
a cladding layer in direct contact to the III-P light emitting layer; and
a region with a graded composition disposed between the cladding layer and the $GaAs_xP_{1-x}$ p-contact layer;
wherein the first and second metal contacts are formed on opposite sides of the semiconductor structure.

8. The device of claim of claim 7 wherein:
the cladding layer comprises $Al_{0.5}In_{0.5}P$; and
the region with graded composition is graded from $Al_{0.52}In_{0.48}P$ to $(Al_{0.3}Ga_{0.7})_{0.52}In_{0.48}P$.

9. The device of claim 7 wherein the $GaAs_xP_{1-x}$ p-contact layer has a graded composition x.

10. The device of claim 7 wherein the $GaAs_xP_{1-x}$ p-contact layer has a composition graded from $x=0$ to $x<0.45$.

11. The device of claim 7 wherein the $GaAs_xP_{1-x}$ p-contact layer has a constant composition x.

12. The device of claim 11 wherein $0.2<x<0.4$.

* * * * *